United States Patent [19]

Herbst et al.

[11] 4,266,235
[45] May 5, 1981

[54] OPTOELECTRONIC SENSOR ACCORDING TO THE PRINCIPLE OF CARRIER INJECTION

[75] Inventors: Heiner Herbst, Haar; Hans-Jöerg Pfleiderer, Zorneding; Rudolf Koch, Germering-Unterpfaffenhofen; Jenöe Tihanyi, Munich, all of, Fed. Rep. of Germany

[73] Assignee: Siemens Aktiengesellschaft, Berlin & Munich, Fed. Rep. of Germany

[21] Appl. No.: 962,893

[22] Filed: Nov. 22, 1978

[30] Foreign Application Priority Data

Dec. 7, 1977 [DE] Fed. Rep. of Germany ....... 2754549

[51] Int. Cl.$^3$ ........................................... H01L 27/14
[52] U.S. Cl. ....................................... 357/30; 357/24; 357/20
[58] Field of Search ............................ 357/30, 24, 20

[56] References Cited

U.S. PATENT DOCUMENTS

| 4,001,861 | 1/1977 | Carnes | 357/24 |
| 4,134,031 | 1/1979 | Weimer | 307/311 |

*Primary Examiner*—Martin H. Edlow
*Attorney, Agent, or Firm*—Hill, Van Santen, Steadman, Chiara & Simpson

[57] ABSTRACT

The invention relates to an optoelectronic sensor with at least one sensor element according to the principle of carrier injection (CID), whereby the surface of a doped semiconductor body is faced by two closely adjoining electrodes insulated from one another and from the semiconductor surface by a thin insulation layer that are controllable via separate control circuits. The semiconductor body contains a more strongly doped area having the type of the semiconductor doping on its surface below one of the electrodes, which area extends slightly into the semiconductor surface lying below the other electrode. Thereby, a narrow potential barrier is formed between the two electrodes, for example, between a line electrode and a column electrode. When an optically generated charge under one electrode is displaced under the other electrode, then this narrow potential barrier prevents a flow back of the charge under the discharged electrode. This makes a floating readout possible, in which the couplings-in of the line circuits onto the column circuits can be eliminated. The more strongly doped area above referred to preferably tapers wedge-shaped under the other electrode and is produced by means of implantation, whereby the field oxide and the electrode, whose edges are beveled, are used as the implantation mask.

9 Claims, 6 Drawing Figures

OPTOELECTRONIC SENSOR ACCORDING TO THE PRINCIPLE OF CARRIER INJECTION

FIELD OF THE INVENTION

The invention relates to an optoelectronic sensor with at least one sensor element according to the principle of carrier injection. Thereby, the surface of a doped semiconductor body is faced by two closely adjoining electrodes that are insulated from one another and from the semiconductor surface by means of a thin insulation layer and that are controllable via separate control circuits (so-called CID-sensor).

BACKGROUND AND SUMMARY OF THE INVENTION

In the electronic acquisition of images according to the principle of carrier injection, a voltage is applied to a capacitor, which consists of a semiconductor body and a metal electrode separated from the semiconductor surface by means of an insulation layer (MIS-capacitor), by means of electrical connections for the semiconductor body and the metal electrode so that the majority carriers located in the semiconductor are drawn off from the substrate and a depletion region arises beneath the metal electrode, in which region the minority carriers optically generated during the exposure time are gathered. By means of a voltage alteration at the metal electrode, collected, optically generated charge carriers can subsequently be injected into the substrate and be read out from there.

In order to be able to acquire a picture grid by means of a plurality of image points, corresponding sensor elements are arranged on the semiconductor surface, which elements, in each case, are formed by a pair of MIS-capacitors capacitively coupled to one another and in whose depletion regions the minority carriers optically generated during the exposure time are gathered. To read out the signal collected in a sensor element, one metal electrode of an element is often held electrically freely floating (so-called "floating"), whereas the potential of the other electrode is diminished in regard to amount. In so doing, the signal charge flows from the second electrode onto the MIS-capacitor of the first electrode and generates a signal there that corresponds to the aggregate of the optically generated charges and, thus, corresponds to the intensity of the light beamed in. By means of a voltage pulse at the first electrode, the collected charge is subsequently injected into the substrate and the sensor is transferred into the empty initial state for the next exposure.

For the acquisition of extensive images, semiconductor bodies are often used, upon whose surface the sensor elements are arranged grid-like in columns and lines and, in each case, one electrode of each element is connected to one electrode of the elements arranged in the same line via a line circuit; whereas, the other electrode of each sensor element is connected to the other electrodes of the sensor elements standing in the same column via a corresponding column circuit. When all column circuits at first lying at an operating voltage during the exposure time are separated from the voltage source, so that they float electrically free, and when a specific line electrode whose voltage is diminished relative to amount is selected via a shift register, then the potential on the column circuits is changed by means of the capacitive coupling to the semiconductor in correspondence with the absorbed inversion charge and can be drawn off as a signal that corresponds to the optically generated charge that is collected in the respective crossing points of the column circuits with the selected line circuit.

The additional capacitive coupling between the two electrodes of an element, however, effects that upon the diminution of the potential at the selected line circuit, i.e., upon displacement of the charge beneath the column electrode, the signal on the freely floating column circuit is superimposed by coupling-ins of the line voltage. These capacitive coupling-ins occur both when the potential of the line circuit is diminished at the beginning of the charge displacement and, with the reversed operational sign, when the line circuit is again reset to the initial signal at the end of the charge displacement. By means of appropriate integration via one pulse edge each of succeeding lines, such coupling-ins can at least be partially eliminated. Each inequality of the coupling-ins among one another, however, falsifies the signal.

The object of the invention is to indicate a CID-sensor that is as simple as possible to manufacture, in which the capacitive coupling-ins compensate as completely as possible.

This is achieved in accordance with the invention, in that, in a sensor of the type initially cited, the semiconductor body contains a more strongly doped area of the type of the semiconductor doping on its surface beneath the one electrode of each sensor element, which area extends slightly into the semiconductor surface lying beneath the other electrode.

In a two-dimensional sensor with sensor elements arranged grid-like in columns and lines, the signal charge is shifted onto the column capacitors by means of the reduction of the potential of the selected line circuit. Simultaneously, the pulse coupling-in ensues from the line circuit onto the column circuit. Accordingly, the charge $Q_{signal}+Q_{pulse}$ is stored in the column capacitor. If one can now reset the potential of the line circuit to the original value without having the charge simultaneously to flow back into the line capacitor, then the charge in the column capacitor is diminished by the capacitively coupled-in charge $Q_{pulse}$, and the potential on the column circuit is now determined only by the signal charge.

The return flow of the charge can be prevented if a potential barrier is generated between the line and column capacitor of each element. In accordance with the invention, this potential barrier is generated in that the more strongly doped area under one capacitor, preferably the line capacitor, extends slightly into the semiconductor surface lying under the other electrode. By means of doping, and by means of breadth and depth of the area, particularly of the edge overlapped by the other electrode (the column electrode), the desired potential barrier can be exactly adjusted.

The region in which the more strongly dosed area located beneath the one electrode is overlapped by the other electrode at its edge, i.e., the breadth in which the more strongly dosed area stretches under the other electrode, advantageously amounts to 0.3 to 1.2 $\mu$m, preferably approximately 0.75 $\mu$m. In the region of this overlapping, the depth of the more strongly doped area advantageously decreases continuously, preferably wedge-shaped, in the direction of the other electrode. Thereby, the wedge (or lip) angle can amount to between 15° and 60°, approximately 20° is preferred.

The semiconductor body can advantageously consist of p-doped silicon; strongly doped polysilicon is particularly suitable for the electrodes. A semiconductor doping of $10^{14}$ through $10^{15}$ cm$^{-3}$ and a doping of the more strongly doped area of $10^{16}$ through $10^{18}$ cm$^{-3}$ is preferred.

A defined geometry of the more strongly doped area and its position to the two sensor electrodes is aimed at. It is therefore advantageous if the doping of the more strongly doped area consists of doping matter that is introduced by means of an implantation mask via ion implantation, whereby the edges of the mask opening are beveled wedge-like in the direction of the more strongly doped area. In the region of the beveled edges, the implanted ions must then first penetrate the implantation mask before they can penetrate into the semiconductor body. The penetration depth of the ions, thus, corresponds to the profile of the mask opening, so that the limitation between the more strongly doped area and the remaining semiconductor body proceeds diagonally with a definite angle beneath the edges of the mask opening.

It is particularly advantageous, if layers are used as a mask, which layers are already provided in most CID-sensors and must be applied; namely, a thicker insulating layer (field oxide film) surrounding the sensor element on the semiconductor surface, and the second electrode itself. In order to manufacture such a semiconductor body, one can, accordingly, first apply a thicker insulation layer with a window covered by a thinner insulation layer on the surface of a doped semiconductor body. The electrode designated "second electrode" in the above explanation is then applied in this window onto the thinner insulation layer. By means of the window in the thicker insulation layer, the ion implantation can now take place. Finally, the sensor cell is completed in that one applies the "first electrode" in the window after having previously covered at least a part of the "second electrode" with a thin insulation layer in order to assure the electric insulation of the two electrodes.

BRIEF DESCRIPTION OF THE DRAWINGS

The invention is explained in greater detail by illustrating and describing a preferred embodiment.

DESCRIPTION OF THE PREFERRED EMBODIMENTS

Figure 1:
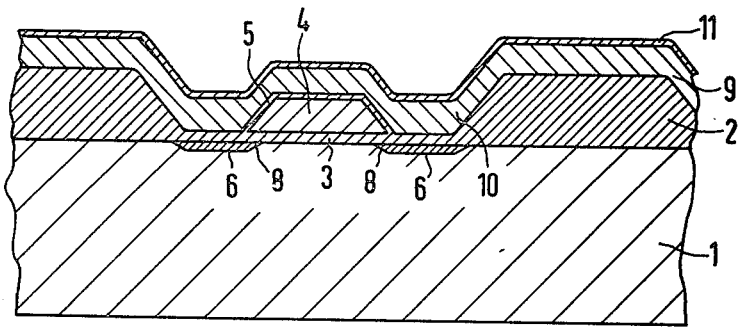
FIG. 1 shows a cross section through a sensor element arranged on a semiconductor surface, whereby the sensor contains sensor cells arranged in lines and columns that are connected to one another via line and column circuits, and wherein the section proceeds lengthwise along a line circuit.
Figure 2:
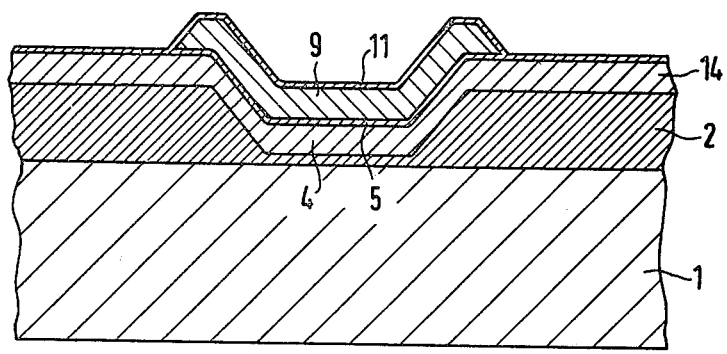
FIG. 2 shows a cross section through the same sensor cell, which, however, proceeds lengthwise along a column circuit.
Figure 3:
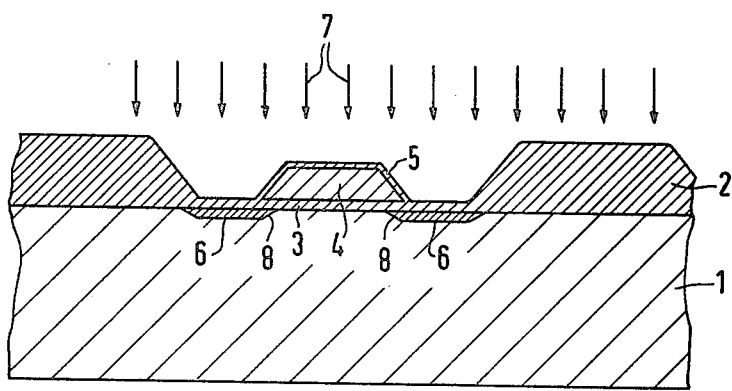
FIG. 3 shows the section according to FIG. 1 before completion of the sensor element, namely during the ion implantation; i.e., before the application of line circuit or line electrode, respectively.

The optoelectronic sensor according to the invention is manufactured in correspondence with FIGS. 1 through 3, in that a relatively thick insulation layer 2, preferably 600 nm SiO$_2$, is first applied to a semiconductor body 1 (for example, silicon with a boron doping of $5 \times 10^{14}$ cm$^{-3}$). This oxide layer 2 serves as a field oxide to separate the individual sensor elements from one another, windows are etched in, and, subsequently, a thin insulation layer 3 of, e.g., 60 nm thickness is formed in these windows (for example, by means of epitaxial growth of a SiO$_2$ layer). Subsequently, the column electrodes 4 are applied, which cover a part of each window opening in the field oxide and extend, as continuous column circuits 14 over all windows of a column. The edge of these column electrodes decreases wedge-like in relation to the surfaces of the window provided for the line electrodes.

The manufacture of layers of insulation or electrode material, respectively, which are applied to a semiconductor surface and whose edges exhibit a defined wedge angle (angle of incline) is described, for example, in the U.S. application, Ser. No. 746,890, assigned to the same assignee as the present invention.

Thus, for example, an initial polysilicon layer can be applied to the insulation layers 2 and 3 and this layer can be sputtered off by means of ion bombardment with the assistance of a mask beyond the surfaces provided for the column circuits 14 or column electrodes 4, respectively. A substance is used for the material for the mask, which itself is subject to erosion during sputtering off. In so doing, the etching mask is attacked during the sputtering off and its edges are beveled. The profile of the etching mask is thereby transferred into the layer to be etched, whereby, however, the cavities generated in the insulating layer by means of the sputtering off do not proceed perpendicular to the surface of the semiconductor body, but rather exhibit a wedge angle of up to 60°. A mask of photoresist is suitable as etching mask for such a procedure.

But the beveled edges can also be produced by first bombarding a polysilicon layer over its entire surface with ions and subsequently exposing it to a wet-chemical or a plasma etching by means of an etching mask. The thin surface regions of the layer exposed to the ion beam exhibit a higher erosion rate upon etching than the deeper regions not exposed to the ion beam. Therefore, the parts of the layer protected by the etching mask are attacked, proceeding from the edge of the mask, with varying etching rates and receive an edge that rises wedge-like.

Such procedures for the manufacture of beveled edges, as, for example, described in connection with the manufacture of an MIS-FET with short channel lengths in the Tihanyi et al, U.S. application, Ser. No. 870,216, assigned to the same assignee as the present invention, can be well reproduced.

Subsequently, a second thin insulation layer 5 is applied in the window, preferably ensuing by means of the epitaxial growth of a second oxide layer. Then, the ion implantation is carried out. But the application of the second insulation layer can also be carried out after the ion implantation.

By means of the ion implantation, areas 6 are formed under the surfaces left free by the column circuits in each window of the oxide layer, which areas are dosed with the same conductivity type as the interior of the semiconductor body 1 itself. Thus, for example, in the case of boron-dosed silicon semiconductor bodies, boron can be implanted with an accelerating energy of, say, 150 keV corresponding to the arrows 7. In the parts of the field oxide openings lying next to the column electrodes 4, these doping particles penetrate through the thin insulation layer 3 into the semiconductor body, whereas the accelerating energy is selected in such a manner that the implantation particles stall in the column electrodes 4. Only in the region of the flattened edges of the column electrodes 4, do the doping particles still partially penetrate into the semiconductor body, whereby the penetration depth decreases upon the increasing thickness of the electrode edges. The edge 8 of the area 6 generated by means of implantation, thus, still extends slightly underneath the column electrode 4, whereby the penetration depth in the region of the overlapping, however, decreases wedge-like in correspondence with the increase of the electrode edges.

The advantage of this manufacturing procedure is that the geometry of the doped area 6 and its position relative to the electrodes 4 can be precisely conditioned by means of an appropriate selection of the accelerating energy, without requiring further lacquer masks or other additional implantation masks. The manufacture of the doped area 6, thus, ensues in a self-adjusting procedure, in which the layers 2 of field oxide and the column electrodes 4, which are already required for the circuit, themselves serve as masks.

In a further step, a second layer of electrode material, for example, a second polysilicon layer 9, is then applied, out of which the line circuits are created by means of an appropriate etching, which line circuits cover the windows of the field oxide layer over the field oxide layer 2 and form the line electrodes 10 which lie next to the column electrodes 4. Subsequently, the entire sensor can be coated with a protective layer 11.

Further steps necessary for the creation of a sensor, like the bonding (or contacting) of the semiconductor body 1 and the line and column circuits, correspond to the state of the art and need not be described and more precisely illustrated here.

Figure 4:
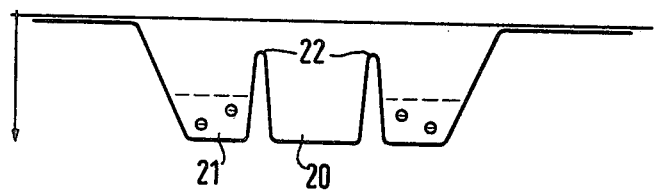
FIGS. 4 through 6 show the potential difference in the sensor cell during operation.

For the operation of the optoelectronic sensor, the electric connections (not illustrated) of the semiconductor body 1, the column circuits 4 and the line circuits 9 are poled to one another in such a manner that the majority carriers are drawn off from the substrate. In the case of a p-doped substrate, the electrodes are thus positively biased in relation to the semiconductor body. In so doing, potential troughs 20 and 21 arise below the electrodes 4 and 10, whose course is schematically illustrated in FIG. 4. Thereby, potential barriers 22 arise under the edges 6 of the column electrodes 4, whose breadth and height depend upon the course of the wedge-shaped edges 6. The minority carriers which are formed by means of the exposure of the sensor are now collected in these potential troughs, particularly in the potential troughs 21 formed under the line electrodes 10.

Figure 5:
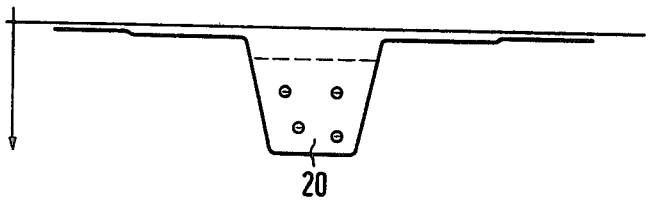
Figure 6:
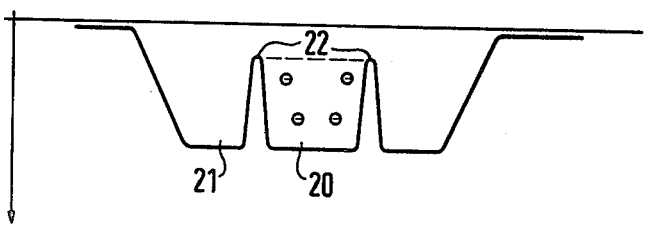

When the column circuits 14 are now left freely floating and the bias of the line circuits in respect to the substrate is diminished in such a manner that the potential in the potential troughs 21 is increased over the potential barrier 22, then all charge carriers are displaced into the potential trough 20 (FIG. 5). Subsequently, the original polarity of the line circuits 9 in respect to the semiconductor body 1 is restored, whereby, however, the charge collected in the potential trough 20 can no longer flow back over the potential wall 22 (FIG. 6). Thereby, a displacement current flowing in the column circuits upon the increase of the line potential will flow back out of the column circuits upon the resetting of the line potential and does not influence the signal adjacent to the floating column circuits, which signal can be drawn off there as a measuring signal.

By boosting the potentials of the line circuits and column circuits, finally, the charge collected in the potential trough 20 is emptied into the substrate and the initial state of the sensor is restored for the next pulse for the collection of optically generated charges.

The sample embodiment described here on the basis of a sensor with row-wise and column-wise oriented electrodes on a p-doped substrate can, of course, be transferred to other dopings and other arrangements of capacitively coupled MIS-capacitor pairs.

It will be apparent to those skilled in the art that many modifications and variations may be effected without departing from the spirit and scope of the novel concepts of the present invention.

We claim as our invention:

1. In an optoelectronic sensor with a body formed of a doped semiconductor with a surface covered by a first insulating layer and having a first electrode formed on the first insulating layer, a second insulating layer formed over the first electrode and the first insulating layer and a second electrode perpendicular to the first electrode formed on the second insulating layer, an improvement comprising:

a window with first and second inwardly oriented wedge-angled edges formed in said first insulating layer, said first electrode is centered in said window on said first insulating layer, insulated from the body, and with first and second wedge-angled edges oppositely oriented to said inwardly oriented wedge-angled edges of said window, and a region having the same type of conductivity as does the body but more strongly doped formed in the body at the surface thereof, substantially between a first inwardly oriented wedge-angled edge of said window and said first oppositely oriented, wedge-angled edge of said first electrode, said region has a substantially constant depth between said two edges and has first and second wedge-shaped ends which extend under said first edge of said window and said first edge of said first conductor.

2. The sensor according to claim 1 including further, a second more strongly doped region having the same type of conductivity as the body, said second region is located adjacent the surface of the body substantially between said second inwardly oriented wedge-angled edge of said window and said second oppositely oriented wedge-angled edge of said first conductor, said second region has a substantially constant depth between said two edges and has first and second wedge-shaped ends which extend under said second edge of said window and said second edge of said first conductor.

3. Optoelectronic sensor according to claim 1, in which said more strongly doped region extends 0.3 to 1.2 $\mu$m, under said first electrode.

4. Optoelectronic sensor according to claim 1, in which said more strongly doped region extends approximately 0.75 $\mu$m, under said first electrode.

5. Optoelectronic sensor according to claim 1, in which the depth of said more strongly doped region decreases continuously beneath said first electrode in the direction toward said first electrode, in a wedge angle.

6. Optoelectronic sensor according to claim 5, in which said wedge angle amounts to between 15° and 60°.

7. Optoelectronic sensor according to claim 5, in which said wedge angle amounts to approximately 20°.

8. Optoelectronic sensor according to claim 1, in which said more strongly doped region contains doping particles put in place by ion implantation by means of an implantation mask, whose mask opening edges are beveled wedge-shaped in direction to the more strongly doped region.

9. Optoelectronic sensor according to claim 8, in which said mask consists partially of a relatively thick insulation layer surrounding the sensor element on the semiconductor surface and consists partially of said first electrode.

* * * * *